(12) United States Patent
Pei

(10) Patent No.: US 8,125,588 B2
(45) Date of Patent: *Feb. 28, 2012

(54) LIGHT EMITTING DIODE MODULE WITH IMPROVED HEAT-DISSIPATION EFFICIENCY

(75) Inventor: Chien-Chang Pei, New Taipei (TW)

(73) Assignees: Everlight Yi-Guang Technology (Shanghai) Ltd., Shanghai (CN); Everlight Electronics Co., Ltd., New Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 13/118,564

(22) Filed: May 30, 2011

(65) Prior Publication Data

US 2011/0255030 A1    Oct. 20, 2011

Related U.S. Application Data

(63) Continuation of application No. 11/890,722, filed on Aug. 7, 2007, now Pat. No. 8,021,032.

(30) Foreign Application Priority Data

May 23, 2007  (TW) ................................ 96208407 U

(51) Int. Cl.
  G02F 1/1333     (2006.01)
  G02F 1/1335     (2006.01)
  F21V 7/04       (2006.01)
(52) U.S. Cl. ............ 349/58; 349/61; 362/612; 362/632; 362/633; 362/634
(58) Field of Classification Search ................... 349/58, 349/61; 362/612, 632–634
See application file for complete search history.

(56) References Cited

U.S. PATENT DOCUMENTS

| 7,611,274 B2 | 11/2009 | Hsiao et al. |
| 7,708,451 B2 | 5/2010 | Jang et al. |
| 2007/0002590 A1 | 1/2007 | Jang et al. |
| 2008/0232134 A1 | 9/2008 | Weng et al. |

Primary Examiner — Nathanael R Briggs
(74) Attorney, Agent, or Firm — Han IP Law PLLC; Andy M. Han

(57) ABSTRACT

Various embodiments of a lighting module are described. In one aspect, a lighting module comprises a metal support, a circuit board, and a plurality of light emitting diodes. The metal support has a recess, sidewalls, and a plurality of holes on the sidewalls. The circuit board is fastened on a bottom portion of the recess of the metal support and has two long sides, two short sides, and a respective plurality of flanges on each of the two long sides. The flanges are inserted into the holes of the metal support to compact the circuit board and the metal support. The light emitting diodes are disposed on the circuit board.

20 Claims, 7 Drawing Sheets

LIGHT EMITTING DIODE MODULE WITH IMPROVED HEAT-DISSIPATION EFFICIENCY

CROSS REFERENCE TO RELATED PATENT APPLICATIONS

This application is a continuation of U.S. patent application Ser. No. 11/890,722, filed Aug. 7, 2007, which claims priority to Taiwan Patent Application Number 096208407, filed May 23, 2007, which applications are herein incorporated in their entirety by reference.

BACKGROUND

1. Technical Field

The present disclosure relates to a light emitting diode device. More particularly, the present disclosure relates to a light emitting diode module.

2. Description of Related Art

The back light module is the key component of the liquid crystal display. The liquid crystal can't generate light by itself. Therefore, the back light module is needed to provide sufficient and symmetrical light, which enables the liquid crystal display panel to show images correctly. The liquid crystal display is used frequently in electronics products, such as monitors, notebooks, digital camera, and projectors. The need for back light modules is increasing accordingly.

The back light module includes light emitting diodes. In the conventional back light modules, the thermal energy generated by the light emitting diodes is dissipated through the thermal conductive material. However, if the thermal conductive material cannot deliver the thermal energy to the environment efficiently, the remaining thermal energy might damage the light emitting diodes.

For the foregoing reasons, there is a need for a new light emitting diode back light module which can dissipates the thermal energy generated by the light emitting diode efficiently to prevent the light emitting diodes from being damaged.

SUMMARY

In one aspect, a light emitting diode module may comprise a metal support, a circuit board, and a plurality of light emitting diodes. The metal support may have a recess and a plurality of holes. The circuit board may be fastened on a bottom portion of the recess of the metal support. The circuit board may have two long sides, two short sides, and a respective plurality of flanges on each of the two long sides. The flanges may be inserted into the holes of the metal support to compact the circuit board and the metal support. The light emitting diodes may be disposed on the circuit board.

In one embodiment, the light emitting diode module may further comprise a liquid crystal display panel and a light guide device. The light guide device may guide light generated by the light emitting diodes to the liquid crystal display panel.

In one embodiment, the light emitting diode module may further comprise a thermal conductive adhesion material. The thermal conductive adhesion material may have a bottom surface in contact with the bottom portion of the recess of the metal support. The circuit board may be fastened on the bottom portion of the recess of the metal support through the thermal conductive adhesion material. At least a portion of heat generated by the light emitting diodes may be transferred to the metal support through the thermal conductive adhesion material.

In one embodiment, the recess of the metal support may comprise two opposite sidewalls in contact with the bottom portion of the recess of the metal support, and the holes may be disposed on the sidewalls of the recess of the metal support.

In one embodiment, the circuit board may be a printed circuit board, a metal substrate, or a ceramic substrate.

In one embodiment, the thermal conductive adhesion material may be a solid.

In one embodiment, the thermal conductive adhesion material may be a liquid.

In one embodiment, the thermal conductive adhesion material may be metal, nonmetal, or a combination thereof.

In one embodiment, the light emitting diodes may be arranged in a direction perpendicular to a direction defined by the flanges extending from the circuit board.

In another aspect, a light emitting diode module may comprise a metal support, a circuit board, a light emitting diode array, and at least one elastic fasten element. The metal support may have a recess and a plurality of holes. The circuit board may have two long sides and a bottom surface that is in contact with a bottom portion of the recess. The light emitting diode array may comprise a plurality of light emitting diodes disposed on a top surface of the circuit board. The at least one elastic fasten element may be disposed between two of the light emitting diodes, and may have two ends inserted into respective holes of the metal support. A main part of the at least one elastic fasten element may press the circuit board to compact the circuit board and the metal support.

In one embodiment, the light emitting diode module may further comprise a liquid crystal display panel and a light guide device. The light guide device may guide light generated by the light emitting diode array to the liquid crystal display panel.

In one embodiment, the light emitting diode module may further comprise a thermal conductive adhesion material. The thermal conductive adhesion material may have a bottom surface in contact with the bottom portion of the recess of the metal support. The circuit board may be fastened on the bottom portion of the recess of the metal support through the thermal conductive adhesion material. At least a portion of heat generated by the light emitting diodes may be transferred to the metal support through the thermal conductive adhesion material.

In one embodiment, thermal energy generated by the light emitting diode array may be at least partially transferred to the metal support through the circuit board and the thermal conductive adhesion material.

In one embodiment, the recess of the metal support may comprise two sidewalls in contact with the bottom portion of the recess of the metal support, and the holes may be disposed on the sidewalls of the recess of the metal support.

In one embodiment, the heights of the sidewalls may be equal. Alternatively, the heights of the sidewalls may be different.

In one embodiment, the at least one elastic element may be made of metal or plastic.

In one embodiment, the thermal conductive adhesion material may be a solid or a liquid. Alternatively, the thermal conductive adhesion material is a soft tape.

In one embodiment, the light emitting diodes may be arranged in a direction perpendicular to a direction defined by the two ends of the elastic fasten element.

In one aspect, a light emitting diode module may comprise a metal support, a circuit board, and a plurality of light emitting diodes. The metal support may have a recess and a plurality of flanges. The circuit board may be fastened on a bottom portion of the recess of the metal support. The circuit board may have two long sides, two short sides, and a respective plurality of holes on each of the two long sides. The flanges may be inserted into the holes to compact the circuit board and the metal support. The light emitting diodes may be disposed on the circuit board.

In yet another aspect, a light emitting diode module may comprise a metal support, a circuit board, a light emitting diode array, and at least one elastic fasten element. The metal support may have a recess and a plurality of flanges. The circuit board may have two long sides and a bottom surface that is in contact with a bottom portion of the recess. The light emitting diode array may comprise a plurality of light emitting diodes disposed on a top surface of the circuit board. The at least one elastic fasten element may be disposed between two of the light emitting diodes, and may have two holes. The flanges are inserted into respective holes. A main part of the at least one elastic fasten element may press the circuit board to compact the circuit board and the metal support.

In one aspect, the light emitting module may be a lighting module or a backlight module.

It is to be understood that both the foregoing general description and the following detailed description are by examples, and are intended to provide further explanation of the disclosure as claimed.

BRIEF DESCRIPTION OF THE DRAWINGS

These and other features, aspects, and advantages of the present disclosure will become better understood with regard to the following description, appended claims, and accompanying drawings.

DESCRIPTION OF THE PREFERRED EMBODIMENTS

Figure 1:
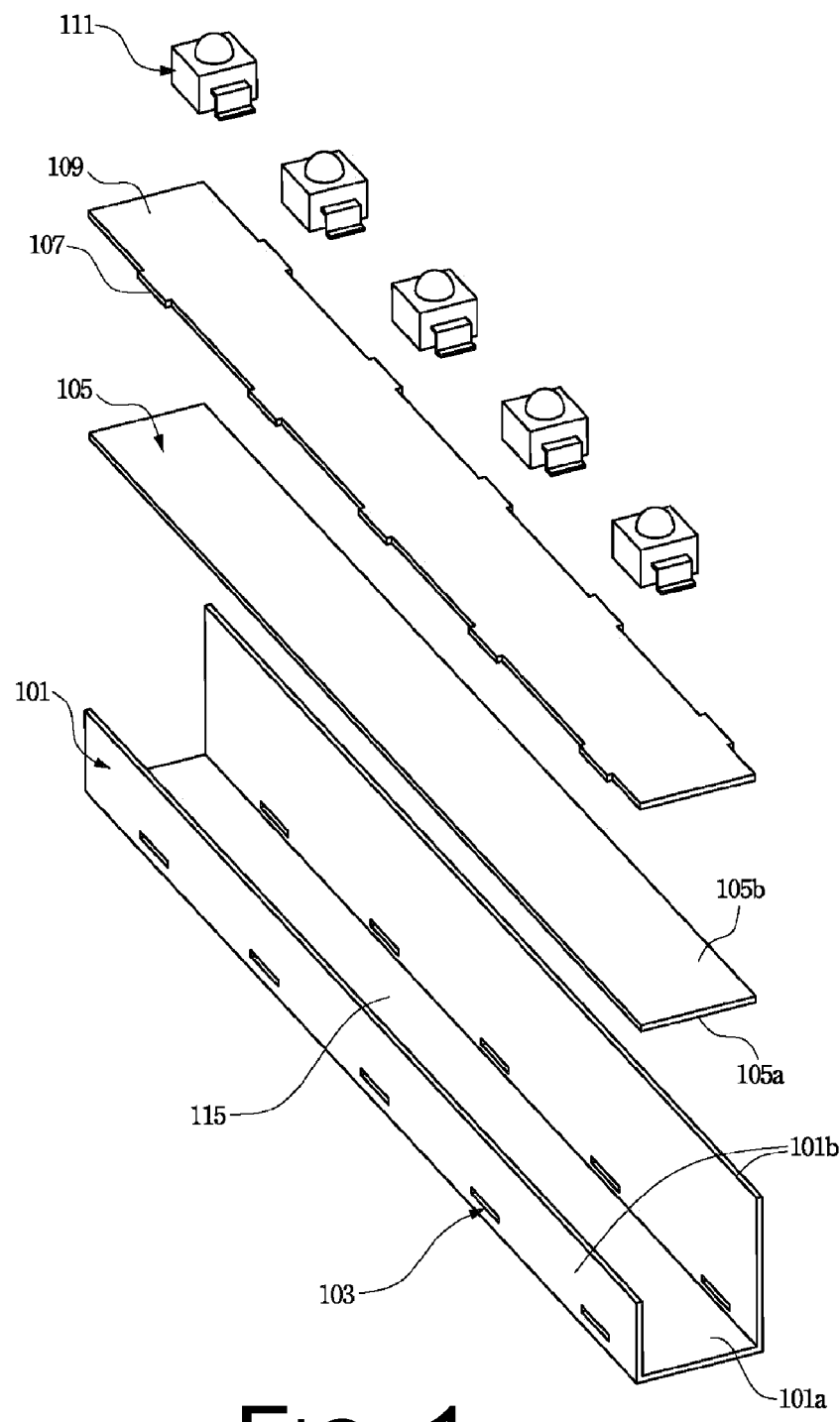
FIG. 1 shows the light emitting diode device according to one embodiment of the present disclosure.

Reference will now be made in detail to the present preferred embodiments of the disclosure, examples of which are illustrated in the accompanying drawings. Wherever possible, the same reference numbers are used in the drawings and the description to refer to the same or like parts.

The following light emitting diode back light module according to the embodiments of the present disclosure lodges the flanges of the circuit board or the elastic elements into the holes of the metal support, which compacts the circuit board, the thermal conductive material and the metal support, such that the thermal energy generated by the light emitting diodes can be dissipated more efficiently.

FIG. 1 shows the light emitting diode device according to one embodiment of the present disclosure. The light emitting diode device includes light emitting diodes 111, circuit board 109 and metal support 101. The light emitting diodes 111 are disposed on the circuit board 109. The circuit board 109 can be a printed circuit board, a metal substrate or a ceramic substrate. The metal support 101, being an L shape or a U shape, has a recess 115. The recess 115 has a bottom 101a and two sidewalls 101b. The sidewalls 101b touch the bottom 101a, in which the heights of the two sidewalls 101b can be the same or different. The holes 103 are disposed on the sidewalls 101b.

The light emitting diode device further includes a thermal conductive material 105 disposed between the circuit board 109 and metal support 101. The thermal conductive material 105 has a bottom-side surface 105a in contact with the bottom 101a of the recess 115, and a board-side surface 105b in contact with the circuit board 109. The thermal conductive material 105 can be a liquid such as a liquid thermal conductive adhesive. The thermal conductive material 105 can also be a solid or a soft tape. In addition, the material of thermal conductive material 105 can be metal, nonmetal or a combination of metal and nonmetal.

Figure 2:
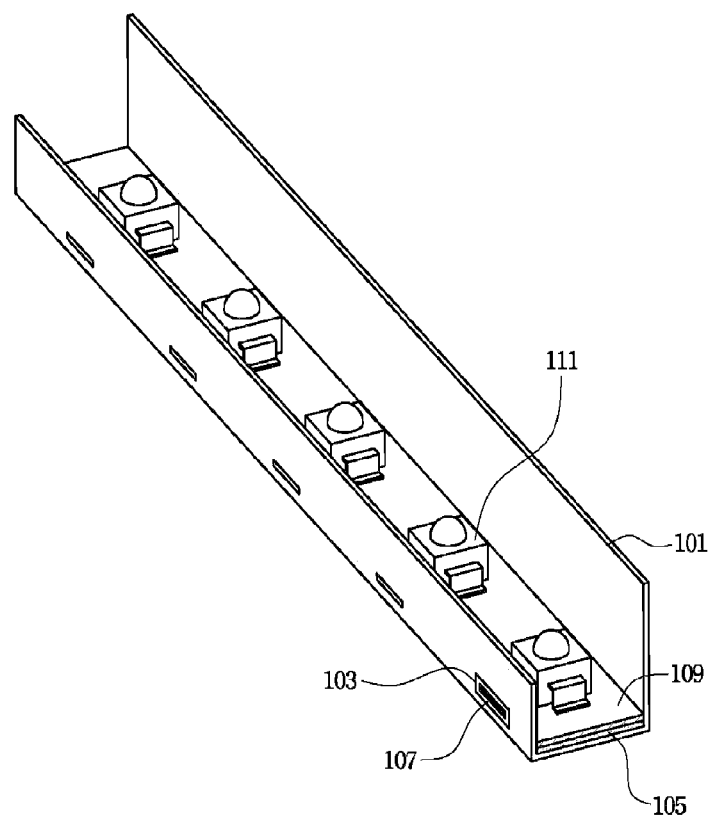
FIG. 2 shows the assembled light emitting diode device according to one embodiment of the present disclosure.

FIG. 2 shows the assembled light emitting diode device according to one embodiment of the present disclosure. By lodging the flanges 107 of the circuit board 109 into the holes 103 of the metal support 101, the circuit board 109, the thermal conductive material 105, and the metal support 101 can be compacted tightly.

Figure 3:
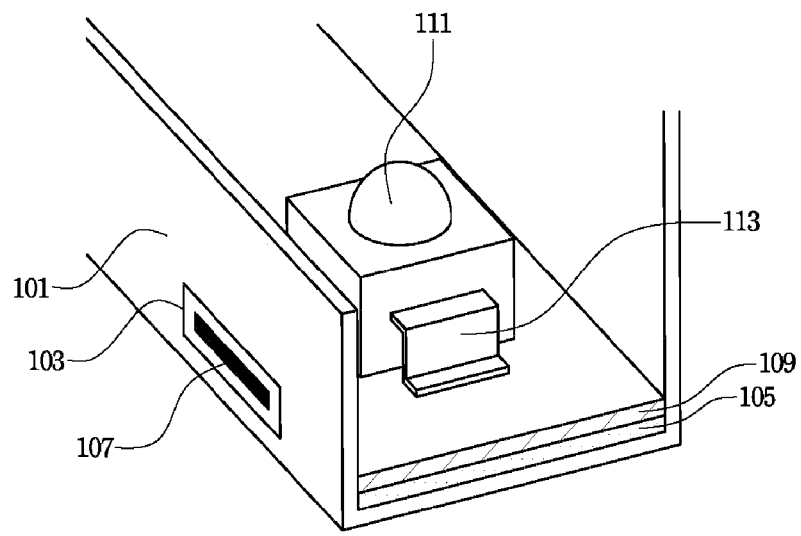
FIG. 3 shows the three dimensional diagram of the light emitting diode device according to one embodiment of the present disclosure.
Figure 4:
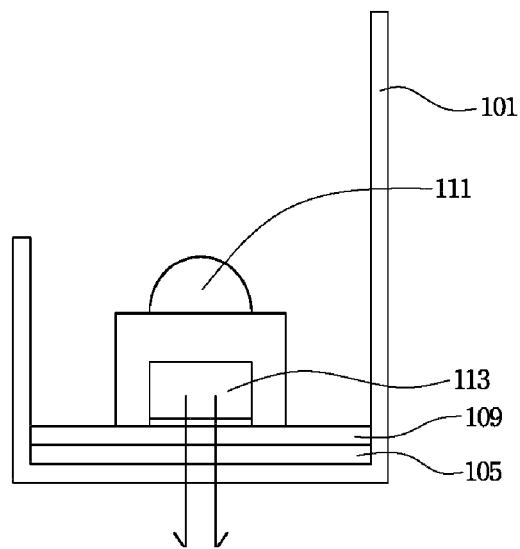
FIG. 4 shows the cross-section diagram of the light emitting diode device according to one embodiment of the present disclosure.

Please refer to both the FIG. 3 and the FIG. 4. FIG. 3 and FIG. 4 show the three dimensional diagram and the cross-section diagram of the light emitting diode device respectively according to one embodiment of the present disclosure. The thermal energy generated by the light emitting diode 111 is delivered to the metal support 101 through the holder 113, the circuit board 109, and the thermal conductive material 105, and then dissipated into the air. By lodging the flanges 107 of the circuit board 109 into the holes 103 of the metal support 101, the circuit board 109, the thermal conductive material 105, and the metal support 101 can be compacted tightly, such that the thermal energy can be dissipated more efficiently.

Figure 5:
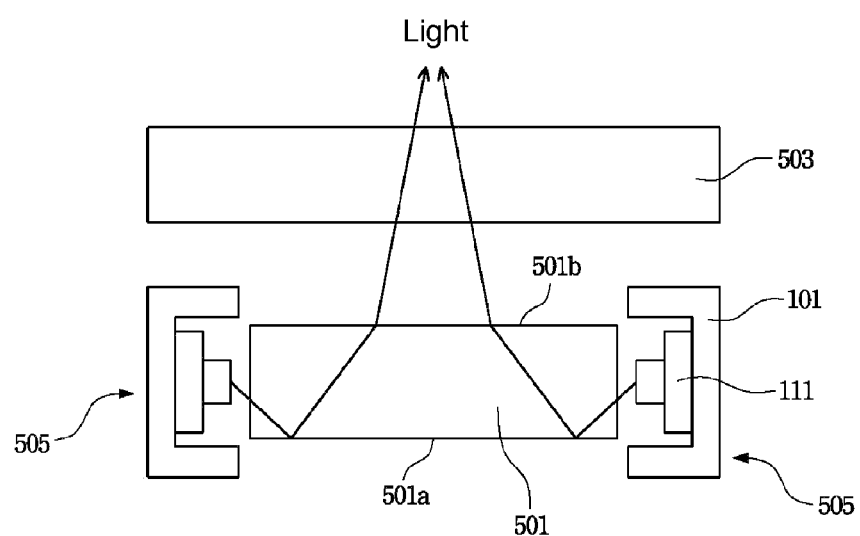
FIG. 5 shows the light emitting diode back light module according to one embodiment of the present disclosure.

FIG. 5 shows the light emitting diode back light module according to one embodiment of the present disclosure. The light emitting diode back light module includes a light guide device 501, a liquid crystal display panel 503, and light emitting diode device 505. Because the liquid crystal of the panel 503 can't produce light by itself, a light source is needed to provide sufficient and symmetrical light which enables the liquid crystal display panel 503 to show images correctly. Therefore, the light generated by the light emitting diode 111 is directed to the panel 503 by the light guide device 501.

The light guide device 503 has a surface 501a and a surface 501b. The surface 501a is a glossy surface. Because the refractive index of the 501a is greater than the refractive index of air, such that most of the light is reflected by the surface 501a, rather than delivered to the air by passing through the surface 501a. On the other hand, the surface 501b is particularly processed, such as forming grooves or dots in the surface 501b, such that the light can be refracted to the air.

Figure 6:
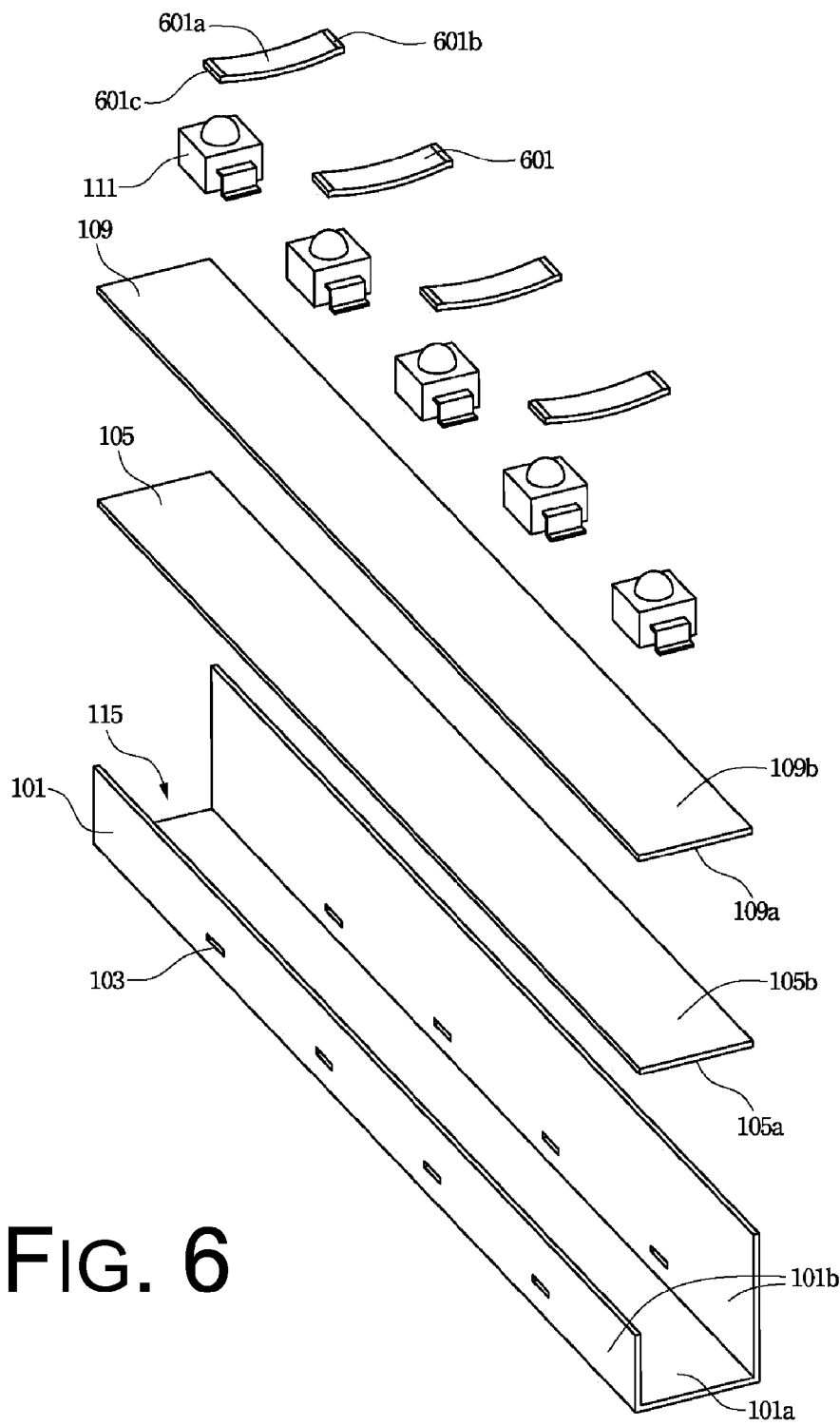
FIG. 6 shows the light emitting diode device according to another embodiment of the present disclosure.

FIG. 6 shows the light emitting diode device according to another embodiment of the present disclosure. The support 101 has a recess 115. The bottom-side surface 105a and the board-side surface 105b of the thermal conductive material 105 contact the bottom 101a of the recess 115 and the surface 109a of the circuit board 109. The light emitting diodes 111 are disposed on the other surface 109b of the circuit board 109. Compare with the FIG. 1, the elastic elements 601 are added to the light emitting diode device shown in FIG. 6. In addition, the circuit board 109 doesn't have any flanges on its sides.

The elastic element 601, made of plastic or metal, has a main part 601a and two ends 601b and 601c. The ends 601a and 601b of the elastic element 601 are lodged into the holes 103 of the metal support 101. The main part 601a of the elastic element 601 presses the circuit board 109 to compact the circuit board 109, the thermal conductive material 105 and the metal support 101.

Figure 7:
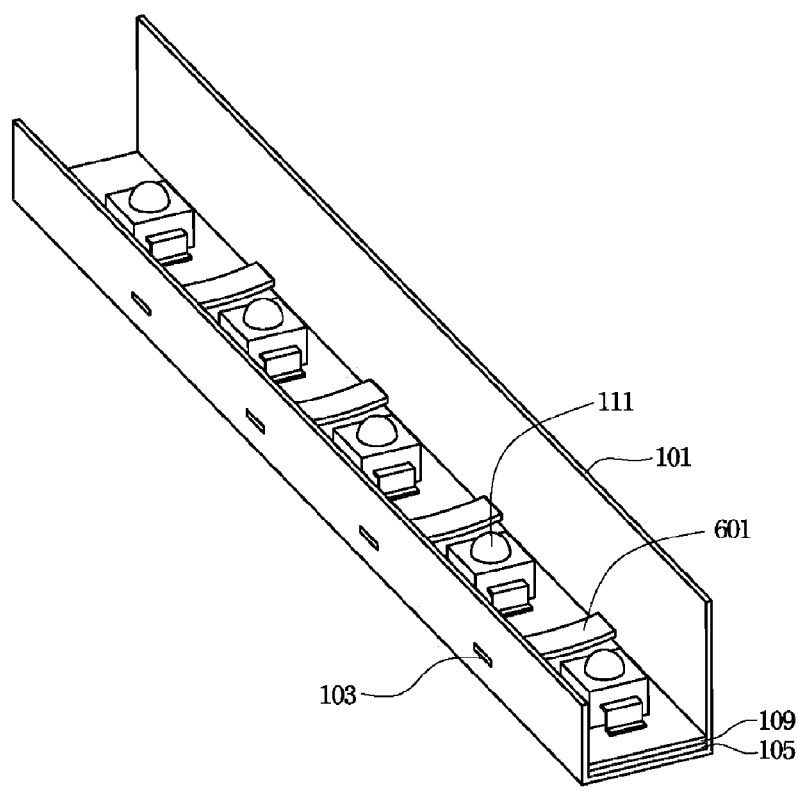
FIG. 7 shows the assembled light emitting diode device according to another embodiment of the present disclosure.
Figure 8:
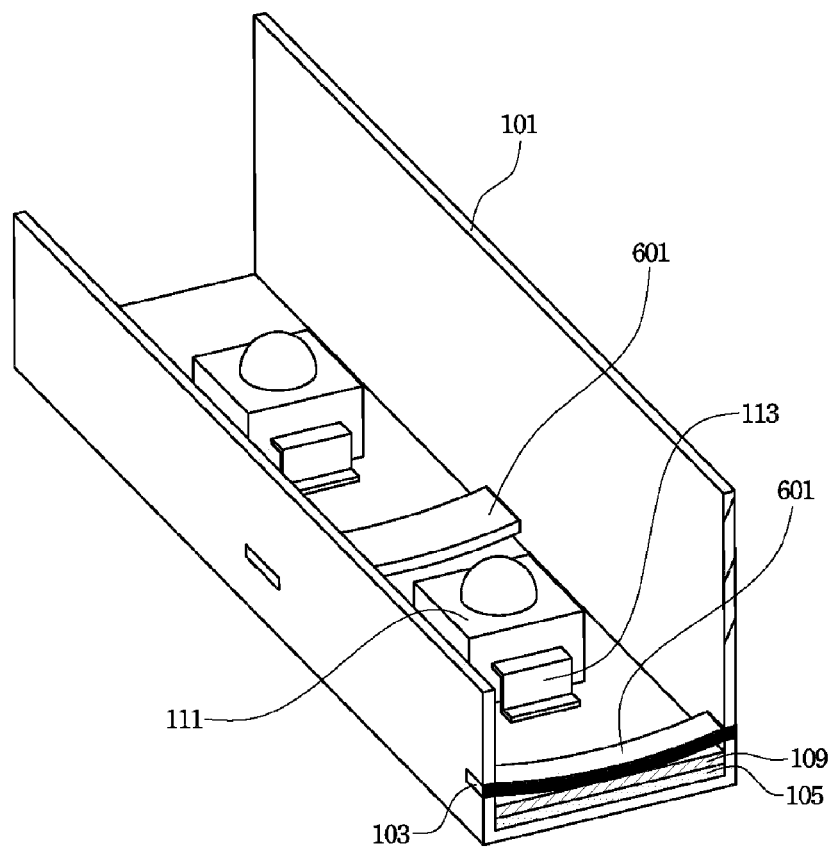
FIG. 8 shows the three dimensional diagram of the assembled light emitting diode device according to another embodiment of the present disclosure.

Please refer to both the FIG. 7 and FIG. 8. FIG. 7 shows the assembled light emitting diode device according to another embodiment of the present disclosure. FIG. 8 shows the three-dimensional diagram of the assembled light emitting diode device according to another embodiment of the present disclosure. In this light emitting diode device, the thermal energy generated by the light emitting diode 111 is delivered to the metal support 101 through the holder 113, the circuit board 109, the thermal conductive material 105. By pressing the circuit board 109 with the elastic element 601, the circuit board 109, the thermal conductive material 105, and the metal support 101 are compactly in contact, such that the thermal energy can be dissipated more efficiently.

According to the above embodiments, the light emitting diode back light module lodges the flanges of the circuit board or the elastic elements into the holes of the metal support, which compacts the circuit board, the thermal conductive material and the metal support. Therefore, the thermal energy generated by the light emitting diodes can be delivered to the metal support more efficiently, so that the thermal energy can be dissipated more effectively.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A light emitting diode module, comprising:
    a metal support having a recess and a plurality of holes;
    a circuit board fastened on a bottom portion of the recess of the metal support, the circuit board having two long sides, two short sides, and a respective plurality of flanges on each of the two long sides, the flanges inserted into the holes of the metal support to compact the circuit board and the metal support; and
    a plurality of light emitting diodes disposed on the circuit board.

2. The light emitting diode module of claim 1, further comprising:
    a liquid crystal display panel; and
    a light guide device guiding light generated by the light emitting diodes to the liquid crystal display panel.

3. The light emitting diode module of claim 1, further comprising:
    a thermal conductive adhesion material having a bottom surface in contact with the bottom portion of the recess of the metal support, wherein the circuit board is fastened on the bottom portion of the recess of the metal support through the thermal conductive adhesion material, and wherein at least a portion of heat generated by the light emitting diodes is transferred to the metal support through the thermal conductive adhesion material.

4. The light emitting diode module of claim 1, wherein the recess of the metal support comprises two opposite sidewalls in contact with the bottom portion of the recess of the metal support, and wherein the holes are disposed on the sidewalls of the recess of the metal support.

5. The light emitting diode module of claim 4, wherein the thermal conductive adhesion material is a solid.

6. The light emitting diode module of claim 4, wherein the thermal conductive adhesion material is a liquid.

7. The light emitting diode module of claim 4, wherein the thermal conductive adhesion material is metal, nonmetal, or a combination thereof.

8. The light emitting diode module of claim 1, wherein the circuit board is a printed circuit board, a metal substrate, or a ceramic substrate.

9. The light emitting diode module of claim 1, wherein the light emitting diodes are arranged in a direction perpendicular to a direction defined by the flanges extending from the circuit board.

10. A light emitting diode module, comprising:
    a metal support having a recess and a plurality of holes;
    a circuit board having two long sides and a bottom surface that is in contact with a bottom portion of the recess;
    a light emitting diode array comprising a plurality of light emitting diodes disposed on a top surface of the circuit board; and
    at least one elastic fasten element disposed between two of the light emitting diodes, the at least one elastic fasten element having two ends inserted into respective holes of the metal support, a main part of the at least one elastic fasten element pressing the circuit board to compact the circuit board and the metal support.

11. The light emitting diode module of claim 10, further comprising:
    a liquid crystal display panel; and
    a light guide device guiding light generated by the light emitting diode array to the liquid crystal display panel.

12. The light emitting diode module of claim 10, further comprising:
    a thermal conductive adhesion material having a bottom surface in contact with the bottom portion of the recess of the metal support, wherein the circuit board is fastened on the bottom portion of the recess of the metal support through the thermal conductive adhesion material, and wherein at least a portion of heat generated by the light emitting diodes is transferred to the metal support through the thermal conductive adhesion material.

13. The light emitting diode module of claim 12, wherein the thermal conductive adhesion material is a solid or a liquid.

14. The light emitting diode module of claim 12, wherein the thermal conductive adhesion material is a soft tape.

15. The light emitting diode module of claim 12, wherein thermal energy generated by the light emitting diode array is transferred to the metal support through the circuit board and the thermal conductive adhesion material.

16. The light emitting diode module of claim 10, wherein the recess of the metal support comprises two sidewalls in contact with the bottom portion of the recess of the metal support, and wherein the holes are disposed on the sidewalls of the recess of the metal support.

17. The light emitting diode module of claim 16, wherein the heights of the sidewalls are equal.

18. The light emitting diode module of claim 16, wherein the heights of the sidewalls are different.

19. The light emitting diode module of claim 10, wherein the elastic element is made of metal or plastic.

20. The light emitting diode module of claim 10, wherein the light emitting diodes are arranged in a direction perpendicular to a direction defined by the two ends of the elastic fasten element.

* * * * *